(12) United States Patent
Edlinger et al.

(10) Patent No.: US 7,371,329 B2
(45) Date of Patent: May 13, 2008

(54) METHOD FOR FILTERING PARTICLES FROM A FLUID

(75) Inventors: Johannes Edlinger, Feldkirch (AT); Claus Heine-Kempkins, Chur (CH); Othmar Zuger, Triesen (LI)

(73) Assignee: OC Oerlikon Balzers AG, Balzers (LI)

( * ) Notice: Subject to any disclaimer, the term of this patent is extended or adjusted under 35 U.S.C. 154(b) by 0 days.

(21) Appl. No.: 11/368,813

(22) Filed: Mar. 6, 2006

(65) Prior Publication Data

US 2006/0147679 A1  Jul. 6, 2006

Related U.S. Application Data

(63) Continuation of application No. 11/104,186, filed on Apr. 12, 2005, now Pat. No. 7,026,046, and a continuation of application No. 10/366,095, filed on Feb. 12, 2003, now Pat. No. 6,884,500.

(60) Provisional application No. 60/356,284, filed on Feb. 12, 2002.

(51) Int. Cl.
| | |
|---|---|
| *B01D 37/00* | (2006.01) |
| *B01D 35/00* | (2006.01) |
| *B32B 5/14* | (2006.01) |
| *B32B 3/26* | (2006.01) |
| *G02B 5/20* | (2006.01) |
| *G02B 27/28* | (2006.01) |

(52) U.S. Cl. ............... 210/767; 210/800; 359/360; 359/486; 385/132; 422/50; 422/68.1; 422/82.08; 422/101; 422/104; 428/212; 428/220; 428/304.4; 428/310.5; 428/314.2; 428/314.8; 428/315.9; 428/457; 428/913; 428/172; 435/4; 436/45; 436/46; 436/177; 436/178

(58) Field of Classification Search ............... 210/650, 210/651, 767, 787, 800, 321.6; 422/50, 68.1, 422/82.08, 101, 104; 436/45, 46, 177, 178; 435/4; 428/304.4, 310.5, 314.2, 314.8, 315.9, 428/457, 913, 195, 212, 220, 315.7; 359/360, 359/486; 385/132

See application file for complete search history.

(56) References Cited

U.S. PATENT DOCUMENTS 6,106,677 A    8/2000  Sandhu (Continued)

FOREIGN PATENT DOCUMENTS

JP    11-014814    1/1999

(Continued)

OTHER PUBLICATIONS

English Translation of Japanese Patent Application No. 11-014814.*

(Continued)

*Primary Examiner*—John Kim
(74) *Attorney, Agent, or Firm*—Pearne & Gordon LLP (57) ABSTRACT

Methods for filtering particles from a fluid are disclosed, wherein an array of microstructures defining respective microchannels having respective minimum widths are used to separate the fluid from particles to be filtered. The fluid flows through the minimum widths into the microchannels defined between adjacent microstructures. The particles to be filtered are prevented from passing through the respective minimum widths, resulting in filtration of those particles from the fluid. The microchannels can be provided with gradient characteristics to separate particles in the fluid according to size.

6 Claims, 5 Drawing Sheets

U.S. PATENT DOCUMENTS

| | | |
|---|---|---|
| 6,122,103 A | 9/2000 | Perkins et al. |
| 6,288,840 B1 | 9/2001 | Perkins et al. |
| 6,454,945 B1 * | 9/2002 | Weigl et al. ................ 210/634 |
| 6,632,399 B1 * | 10/2003 | Kellogg et al. ............... 422/72 |
| 6,709,869 B2 * | 3/2004 | Mian et al. ................... 436/45 |
| 6,875,619 B2 * | 4/2005 | Blackburn ................. 436/514 |
| 6,884,500 B2 * | 4/2005 | Edlinger et al. ......... 428/310.5 |
| 7,026,046 B2 * | 4/2006 | Edlinger et al. ......... 428/310.5 |
| 2002/0123059 A1 * | 9/2002 | Ho ............................... 435/6 |
| 2002/0196435 A1 * | 12/2002 | Cohen et al. ............... 356/246 |
| 2004/0259237 A1 * | 12/2004 | Kellogg et al. .......... 435/287.1 |

FOREIGN PATENT DOCUMENTS

| | | |
|---|---|---|
| JP | 11014814 A | 1/1999 |
| WO | 02/091461 A2 | 11/2002 |
| WO | 02091044 A | 11/2002 |
| WO | 03/010289 A2 | 2/2003 |

OTHER PUBLICATIONS

U.S. Provisional Appl. No. 60/307,668, filed Jul. 25, 2001, Title: High Throughput Nanofluidic Chip for DNA Sizing.

* cited by examiner

METHOD FOR FILTERING PARTICLES FROM A FLUID

This application is a continuation of U.S. application Ser. No. 11/104,186 filed Apr. 12, 2005, now U.S. Pat. No. 7,026,046, and is a continuation of U.S. application Ser. No. 10/366,095 filed Feb. 12, 2003, now U.S. Pat. No. 6,884,500, which claims benefit of U.S. Provisional Application No. 60/356,284 filed Feb. 12, 2002.

BACKGROUND OF THE INVENTION

The present invention relates to optical and to analytical components comprising embedded microchannels. The present invention also relates to the method of producing such optical and analytical components. The present invention also relates to the use of such optical and analytical components.

Optical components comprising micron or submicron surface structures are widespread in use. The optical field related to such components is the field of diffractive optics. Among different products one of the most famous representative is the compact disc which is roughly speaking a grating structure in a plastic substrate coated with a metal. Other examples are antireflection gratings, grating couplers and wire grid polarizers a well as the micro-electro-mechanical systems and resonant grating devices.

Figure 1:
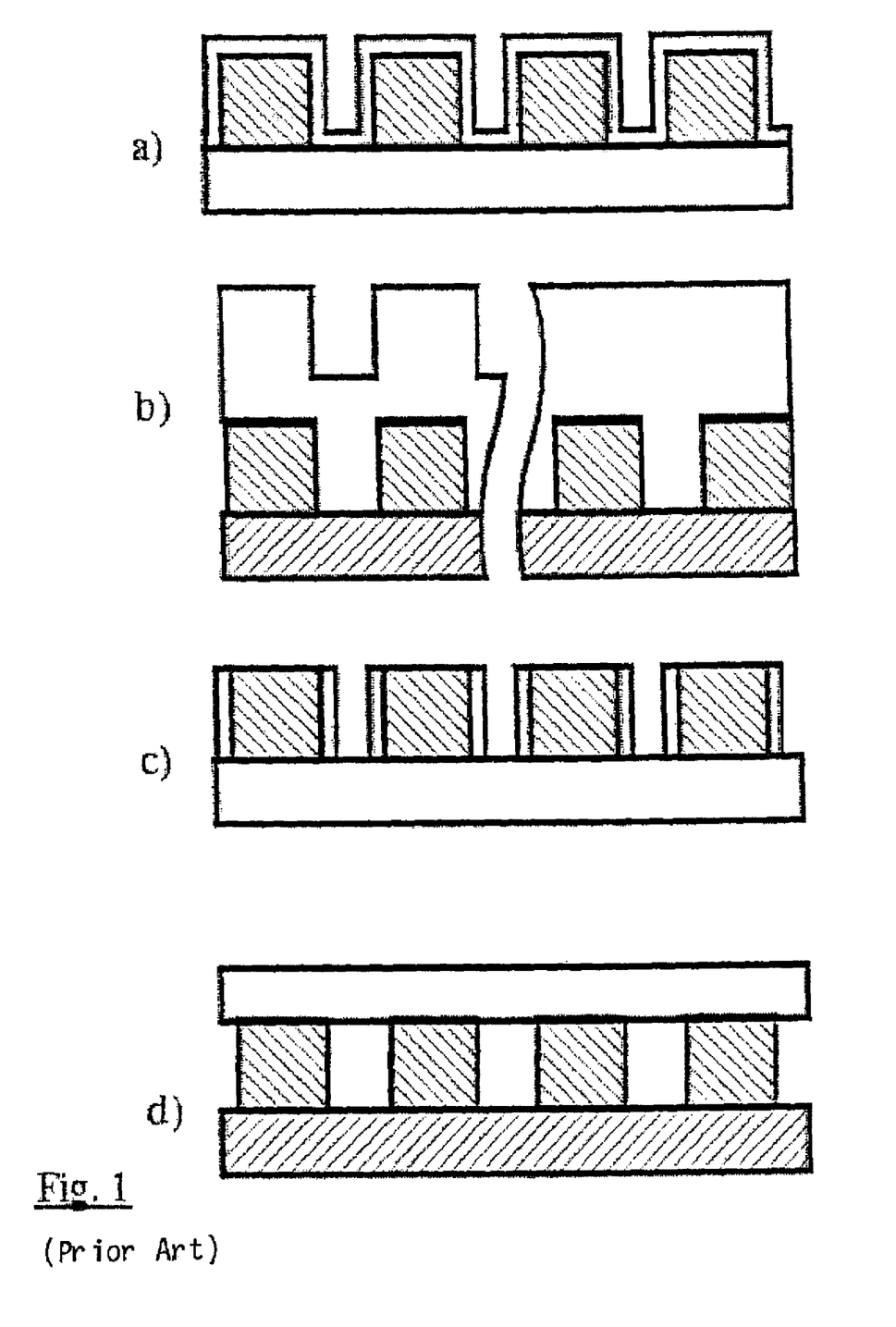
FIG. 1a is a cross-section of a structure with prior art conserving coating.
FIG. 1b is a cross-section of a structure with prior art filling coating.
FIG. 1c is a cross-section of a structure with prior art selective coating.
FIG. 1d is a cross-section of a structure with prior art cover layer.

Many of these systems need to be coated either in order to enhance their optical performance or in order to electrically contact the surface or in order to protect the structures. Among the coatings which are typically used in such kind of structures there are four different classes:

- conserving coatings: coatings which need to cover all parts of the surface with a thin, homogeneous layer, mainly conserving the surface structure (see FIG. 1a).
- filling coatings: coatings which need to fill the structures completely. This class of coating can be subdivided further in coatings where the surface profile needs to be reproduced on the coating surface (see FIG. 1b left side) and coatings where the structure needs to be smeared out (see FIG. 1b right side).
- selective coatings: only parts of the structure need to be coated. Coating of other parts needs to be avoided (see FIG. 1c).
- cover layers: coatings which cover only the structure without penetrating the valleys, i.e. burying or embedding the structures while leaving the index distribution within the structures mainly unchanged (see FIG. 1d).

Conserving coatings have the goal to at least substantially conserve the surface structure. The coating needs to be of principally homogeneous thickness independent of the orientation of the features of the surface. This can be realized for example with chemical vapor deposition (CVD) methods, where the surface to be coated is chemically activated and a chemical reaction leads to deposition of material on every part of the substrate in a homogeneous way.

In order to realize filling coatings, chemical vapor deposition can be used as well. However, since the deposition of the particles strongly depends on the flux of the reactive gas used and the small structures create turbulences, as well as flux inhomogeneities, as a consequence inhomogeneities in coating thicknesses may appear. In addition, since the deposition rate (defined as number of particles deposited per time unit) is proportional to the surface presented in an area, this type of coating technique tends to smear out the structure very efficiently. If the structure is to be reproduced in the coating (see FIG. 1b), this kind of filling technique cannot be used.

Other techniques such as sputtering can also be used to fill the structures. However especially for structures with small feature sizes and a high aspect ratio (aspect ratio=the depth of the structure related to the minimum feature size), this often is quite difficult, since self attenuating shadowing effects lead to overhanging structures and to inhomogeneous thicknesses of the coating. Note that this is a problem well known with coatings for semiconductor devices. As described in DE 197 02 388 the sputtering process for semiconductor devices with small feature sizes exactly shows the aforementioned disadvantages.

In order to realize selective coatings evaporation can be done from a more or less distant point source. If the process is realized in such a way that the mean free path of the coating particles is larger than the distance from the source to the substrate to be coated, the coating will be a directional process, thus defining the direction of the particle movement. If the direction is parallel to the normal of the substrate almost no particles will be deposited on the vertical interfaces of the structures.

Sometimes the surface structures need to be conserved and mainly the vertical surfaces need to be coated. In this case a collimating device can be used. Then even sputter sources are applicable, as disclosed in U.S. Pat. No. 6,210,540. Here a coating mask-blocks out the particle flux propagating in directions parallel to the normal of the substrate mechanically. The coating zone is restricted to areas where the particle flux is at an oblique incidence angle with respect to the normal of the substrate to be coated.

Note that in this case a high percentage of the coating material is deposited on the mask and therefore lost for the coating on the substrate. This results in low deposition rates as well as in low efficiency for sputter target use.

Sometimes tilted directional selective coatings in combination with the shadowing effects are used to create etching mask on the top of a structure, covering only the upper parts and leaving the lower parts of the structure unprotected and open for a following etching procedure. This as well can be done either with point sources and sufficient mean free paths of the coating particles or with collimating masks.

For cover layers the situation is quite different. These layers are mainly used for protecting the underlying structures. None of the aforementioned methods can be used without major modifications leading to additional production costs. State of the art teaches that such structures are needed for example for embedded wire grid polarizers as disclosed in U.S. Pat. No. 6,288,840. However nothing is said how such cover sheets could be realized. In today's applications it is common to protect the structures using thin glass cover sheets, mechanically cemented to the structures. Note that in many cases no adhesive can be used in the structure region since this would fill the structures and influence the optical performance of the device. In addition, in order to fully protect the small features, such devices very often have to be sealed. This is quite expensive to realize and very often the disadvantageous optical influence of the glass sheet cannot be avoided.

It is clear from the description above that according to procedures of the described prior art it is not known how to practicably cover the microstructures without almost completely filling the grooves in the structure. For example with wire grid polarizers as discussed in U.S. Pat. No. 6,288,840 (hereinafter referred to as '840), it is necessary that the grooves between the metal rods form hollow spaces, since an increase of the index of refraction in the grating grooves directly affects the performance of the component. However as is discussed in '840 it is advantageous to use an embedded wire grid polarizer. As described in '840 such a polarizer comprises a first layer, a second layer and an array of parallel, elongated, spaced apart elements, sandwiched between the first and the second layers. The inventors mention that in a preferred embodiment the material in the grooves will be air or vacuum, but for reasons of practicality other materials may be used. It is concluded that the realization of embedded groove structures is not practicable.

BRIEF SUMMARY OF THE INVENTION

The purpose of the present invention is to overcome the problems of the aforementioned prior art. It is the objective of the present invention to disclose practicably realizable designs of components with embedded hollow spaces or channels or volumes of predetermined geometry in the micrometer or sub-micrometer range. As a collective term for hollow spaces or channels or volumes of predetermined geometry in the micrometer or sub-micrometer range the term "microchannels" will be used. It is yet another purpose of the present invention to disclose a method of producing such components without sacrificing practicability and profitability. It is yet another purpose of the invention to disclose a number of optical and/or analytical systems based on such devices.

Optical components are components comprising means for specifically influencing electromagnetic fields in a predetermined way when such an electromagnetic field is established within or at the border of the optical component.

In an embodiment of the present invention an optical component comprises a substrate; an array of microstructures on the substrate; and microchannels formed by side walls of adjacent microstructures, a width of the microchannels varying as a function of distance to the substrate, said width continuously decreasing with increasing distance from the substrate within at least one distance-interval.

A consequence of the fact that a narrowing of the width of the microchannels with increasing distance to the substrate is realized is that the microstructures are less open to the environment and therefore are protected since large dirt or dust particles are prevented from invading the microchannels.

In a further embodiment the optical according to the present invention at least some of the microstructures of said array comprise a central body coated with a cover on a top of said central body, said cover at least partially covering side walls of the central body thereby forming a microstructure side wall geometry extending over the top of the central body in such a way that said width has local a minimum above the top of the central body.

The material of the central body may be different to the material of the cover. This has the advantage that the geometry of the central body could be chosen rectangular leading together with the air in the microchannels to an optical effect. The cover can be chosen just to narrow the width of the microchannel in the cover region without negatively influencing said optical effect, however protecting the central body-microchannel configuration. Since the cover narrows the width at least a local minimum above the top of the central body is realized. The at least local minimum can be a general minimum of width of the corresponding microchannel.

In a further embodiment of the present invention the optical component the local minimum is equal to zero and the microchannel is completely separated from the environment of the component.

With such a component the microchannels are completely protected and it is even possible to further overcoat or further process, as for example cement the device between glass prisms without touching the microstructures and disturbing their performance.

An additional feature to one of the embodiments of the present invention can be that said elements have at least approximately the shape of elongated rods and form at least locally a periodic grating structure.

Depending on the grating period relative to the wavelength used periodic grating structures can be used as diffraction gratings, as antireflection gratings or among others as, birefringent coating layers. Their performance strongly depends on the material in the grating grooves. With the embodiment as described such a grating structure can be realized as an embedded structure without loss of optical performance, since the index distribution in the grating grooves remains almost. This, to give an example can be used to realize a wire grid polarizer.

In a further embodiment of the present invention the local minimum is at least close to zero and an at least almost closed microchannel is realized.

This minimum can be chosen as small as 5 nm or even below. The process according to the present invention for realizing such components allows to control very accurately the final minimum of the width of the microchannels.

In a further embodiment of the present invention the central body comprises a first layer system with at least one metallic layer and the cover comprises a second layer system with at least one dielectric layer.

This allows to combine the well know optical effects of thin film multilayer stacks with the advantages of microstructures.

Analytical platforms are components comprising at least auxiliary means for manipulating fluidic, gaseous or solid measurement samples when such measurement samples are present within or at the surface of the components.

In an embodiment of the present invention an analytical platform comprises a substrate; an array of microstructures on the substrate; microstructures, a width of the microchannels varying as a function of distance to the substrate, said width continuously decreasing with increasing distance from the substrate within at least one distance-interval.

In a further embodiment of the present invention the analytical platform is designed for filtering particles of given size out of a fluid. In this embodiment a minimum dimension of said width within or above said distance-interval is equal to or slightly less than a minimum dimension of particles to be filtered out of a fluid.

A method according to the present invention for filtering particles of given size out of a fluid comprises the steps of:
  providing an analytical platform comprising: a substrate; an array of microstructures on the substrate; microstructures, a width of the microchannels varying as a function of distance to the substrate, said width continuously decreasing with increasing distance from the substrate within at least one distance-interval, wherein a minimum dimension of said width within or above said distance-interval is equal to or slightly less than a minimum dimension of particles to be filtered out of a fluid;
  applying the fluid to be filtered to a surface of the platform;

using capillary forces to make the fluid to be filtered entering the microchannels and to prevent the particles to be filtered out from entering the microchannels; and using at least one of capillary forces, gravity forces, and centrifugal forces to spread out the filtered fluid along the microchannels into areas of the analytical platform where no fluid to be filtered was applied to the surface.

In a further embodiment of the present invention a method for producing an array of at least partially embedded microchannels comprises the steps of:

providing a substrate;

applying surface microstructures to said substrate;

guiding said substrate to a vapor treatment;

depositing a cover on said microstructure using a physical vapor deposition technique to guide coating particles to said microstructures; and using shadowing effects of the coating mechanism to narrow at least partially a width of the upper parts of side walls of the microstructures thereby forming at least partially embedded microchannels.

To summarize the present invention arrays of embedded microstructures comprising a cover material which not only covers the top of microstructures as shown in the prior art but at least partially covers the side walls of the microstructures to be embedded. It is subject matter of the present invention that this side wall coating forms a new sidewall geometry extending over the top of the original uncoated structure in such a way that the sidewall extension above the top of the original central body has a minimum. This minimum can be zero, completely separating microchannels from the environment. For many applications in semiconductor components isolated realizations a such kind of microchannels are fabricated by accident with standard sputtering techniques. In these applications great effort and additional processing is invested in order to avoid such structures. It is part of the present invention to incorporate such structures in the layout of the optical component and/or analytical platforms. It is as well part of the present invention that central bodies as well as the cover of central bodies can comprise layer systems of materials with different optical constants, i.e. a multilayer stacks and that the layout of the layer systems can be chosen in order to enhance the optical performance or in order to add additional characteristics i.e. optical, chemical or mechanical characteristics.

It is as well part of the present invention to manipulate the angular deposition rate of the coating particles reaching the substrate surface to be coated in order to realize the extended sidewall coating. It is subject matter of the present invention to influence this angular deposition rate in a defined way with the choice of the coating conditions and to avoid the use of coating masks.

BRIEF DESCRIPTION OF THE DRAWINGS

FIG. 5a is a cross-section of a structure with microchannels connected to the environment used as analytical platform; and FIG. 5b is a top view of the structure of FIG. 5a.

DETAILED DESCRIPTION OF THE INVENTION

Reference will now be made to the drawings in which the various elements and preferred embodiments of the present invention will be discussed.

A. Devices

Illustrated in FIGS. 2a, 2b and 2c is a component 1 with embedded microchannels 15,15'. This component 1 comprises a substrate 3, a grating region G and a coating region C. The grating region G comprises first structure domains 5 and second structure domains 7. The first structure domains 5 comprise materials different from air. The first structure domains 5 can comprise either a dielectric material or a combination of dielectric material layers or a metal or a combination of different metal layers. It can comprise as well a combination of dielectric layers and metal layers.

The second structure domains 7 comprise the lower part of microchannels 15,15'. On top of the first structure domains 5 within the coating region C is a coating 9. As can be seen from FIGS. 2a-2c, at least the upper part of the side walls of the first structure domains 5 are covered by side wall covers 11. With respect to the cover 9 and the side wall covers 11 the first structure domains form central bodies at least partly encapsulated. The first structure domains 5 together the side wall covers 11 in the grating region G and the coating 9 in the cover region C form microstructures. Adjacent microstructures form the side walls of the microchannels 15,15'.

The side walls of the microchannels 15,15' within the grating region G which are at least in the upper part formed by the side wall covers 11 are continuously extended into the cover region C, forming the side walls of the upper part of the microchannels 15,15'. The cross section of the upper part of the microchannels 15,15' has the shape of a cross section of the shoulder of a bottle. In FIG. 2a the bottlenecks are completely closed and therefore the microchannels 15 are separated from the environment. However, as shown in FIG. 2b the microchannels 15 also can be connected to the environment by connection channels 17. In any case width of the microchannels 15,15' varies as a function of distance to the substrate and is continuously decreasing with increasing distance to the substrate 3 within at least one distance-interval.

A high number (more than 5) of spaced apart microstructures applied to the substrate, wherein the distance of adjacent microstructures is at most several microns, form an array of microchannels 15,15'.

At least the upper part of the side walls of the first structure domains 5 are coated with the side wall covers 11. Coating the bottom of the microchannels 15,15' and even coating the lower parts of the first structure domains 5 can be avoided with the process for producing such components according to the present invention.

As already mentioned the microchannels 15,15' can be connected to the environment by connection channels 17, as shown in FIG. 2b. The microchannels 15,15' can be filled with a fluid if a droplet of the fluid is applied to the top of the cover region, covering at least two of the microstructures and therefore sealing at least one connection channel 17. Capillary forces then drag the fluid into the at least one microchannel 15,15'. This fluid, as an example can be a melt of a metal or a biological essay. The width of the connection channels 17 determines the size of the particles allowed to enter the microchannels 15,15'. This filtering effect can be used in analytical applications as will be explained further down.

Further shown in FIG. 2b is the possibility to let the cover region C comprise a structured multilayer stack 9'. This is particularly interesting if the component according to the present invention is an optical component. This structured multilayer stack 9' can be designed in such a way that it acts as an antireflection layer. It is worth mentioning that in most cases it is favorable to use transparent glass substrates such as quartz or BK7 or transparent plastic substrates such as Polycarbonate or PMMA. Another possibility would be to realize a color filter or neutral density filter on the structure. In the case where the dimensions of the microstructures and microchannels 15,15' are in the order of magnitude or below the wavelength of the electromagnetic fields impinging on the optical component rigorous diffraction theory or effective medium theories can be applied in order to simulate the optical characteristics and to optimize the layout of the coating structure. If the connection channels 17 are closed, as shown in FIG. 2a the structured multilayer stack could be covered by an unstructured multilayer stack. In addition components comprising additional multilayer stacks between the substrate 3 and the grating region G can be realized.

In FIG. 2c shown is a component where the bottom of the second structure domains 7 is coated in such a way that the microchannels 15' form thin, elongated channels. Here again capillary forces can be used to fill these channels with a fluid.

B. Fabrication

As discussed above prior art teaches that standard sputter techniques applied to small and deep structures in many cases lead to hollow spaces (DE 197 02 388) and the person skilled in the art tries to avoid these hollow spaces. It is subject matter of the present invention to control the angular distribution of the particle deposition rate on the substrate in such a way, that a well defined shape of these hollow spaces, leading to microchannels 15,15' is realized. The angular distribution of the coating particles depends on a various number of coating parameters.

The angular distribution depends on the target structure, whether it is crystalline, polycrystalline or amorphous. It depends also on the geometry of the target, whether it is flat or curved. The angular distribution depends as well on how particles generally are excited from the target source, for example by a collimated or focused excitation-beam and whether the angle of incidence of the excitation beam is obtuse or acute. The angular distribution of the coating particles further depends on what kind of excitation beam, if any, is used: gas, ions, electrons, laser light is possible among others.

Once the particles are excited from the target, there is a certain probability of scattering, depending on the gas pressure, the atom mass of the gas used, the flux of the gas and, up to a certain extend, the orientation of the flux of the gas. The probability of scattering depends as well on the path a particle has to propagate before hitting the substrate.

In coating procedures where the substrate with the first structure domains 5 to be coated passes the target in close distance (see FIGS. 3a-3c), power modulation or modulation of plasma frequency allows to influence the angular distribution of coating particles impinging on the first structure domains 5 on the substrate. This angular distribution determines the final geometry of the microstructures and therefore the geometry of the microchannels 15,15'.

Shadowing effects of the side walls of the first structure domains 5 play an important role for this process. As an example we investigate a substrate with a surface grating structure. The grating structure comprises lamellar first structure domains 5 where the grating region G is 500 nm thick and the first structure domains 5 as well as the second structure domains 7 have a width of 250 nm. The second structure domains 7 have an aspect ratio of 500 nm/250 nm=2. (The aspect ration is the ratio of feature height to feature width). We define the non-conical plane to be the plane which is spanned by the grating vector and the normal on the surface of the substrate. The propagation vector of coating particles which are impinging on and in the grating region G can have a vector-component parallel to the non-conical plane. If we restrict the coating to coating particles where this vector-component is tilted 45° or more to the normal on the surface of the substrate only the upper half of the side walls are coated. This is because the lower half of the side walls are shadowed by the opposing side wall of the adjacent microstructure. This effect is even self-attenuating because with increasing coating thickness of the upper half of the side walls the distance between the coated side walls decreases and as a consequence the shadowing effect increases.

Figure 3:
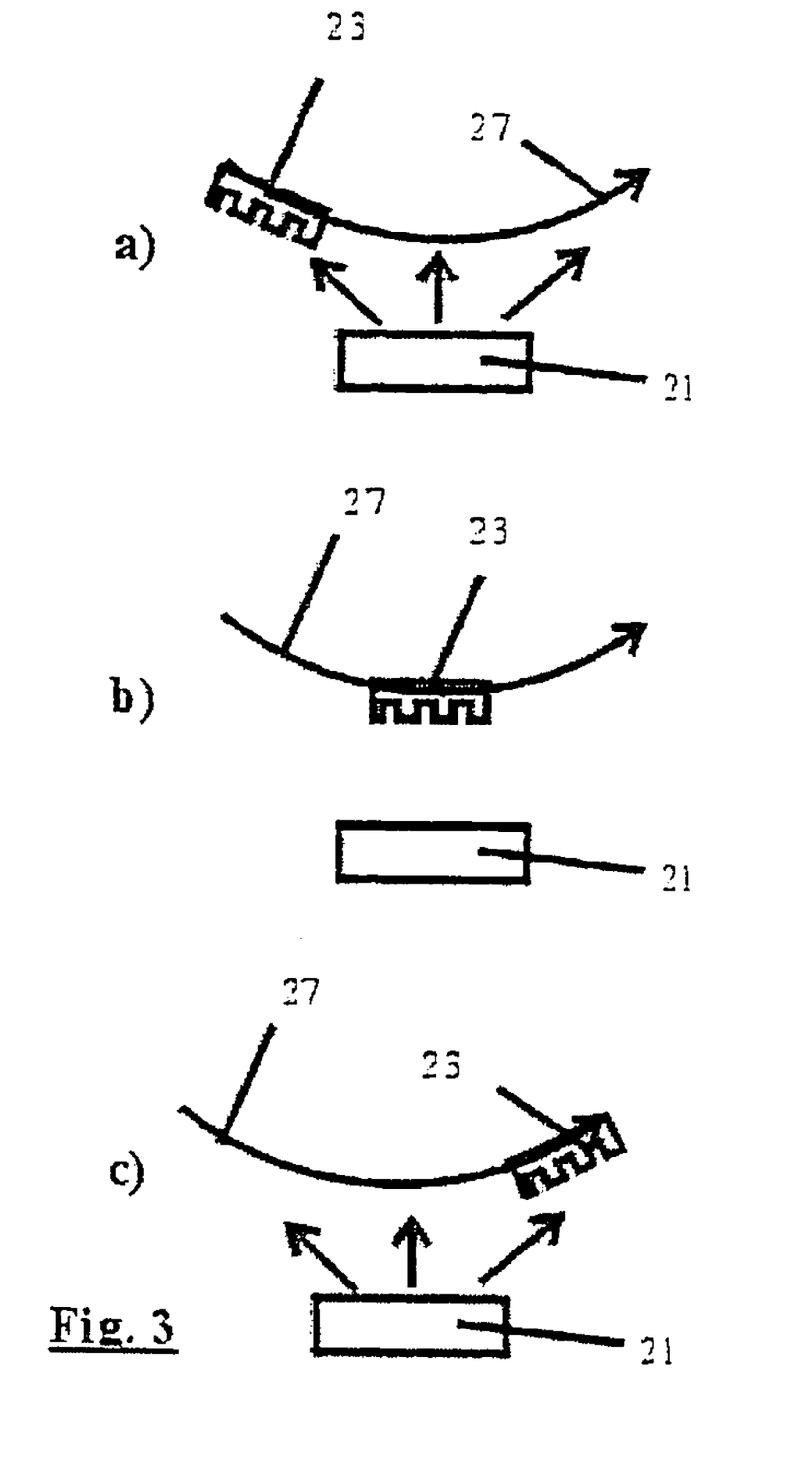
FIG. 3a shows schematically a first snapshot of a coating procedure illustrating a substrate moving to a coating source.
FIG. 3b shows schematically a second snapshot of the coating procedure of FIG. 3a illustrating the substrate close to the coating source.
FIG. 3c shows schematically a third snapshot of the coating procedure of FIG. 3a illustrating the substrate past the coating source.

FIG. 3 shows with three typical coating snapshots how the shadowing effect can be practicably realized: The coating source 21 comprises a target producing coating particles. The structured substrate 23 is fixed on a rotating substrate mount 27 in such a way that in position 3b of the rotating mount the structured surface faces the coating source and the grating lines are at least almost parallel to the rotation axis of the rotating mount. The coating process can be switched off as long as the substrate is directly in front of the target (see FIG. 3b). Switching on the coating process during positions according to FIG. 3a and FIG. 3c results in predominantly coating the side walls of the first structure domains 5 in a symmetric way as well as the top of the first structure domains 5. Switching on the coating process in positions according to 3a only or 3c only results in an asymmetric coating of the side walls. Note that switching on the coating process during all three positions 3a 3b and 3c also can result in to shadowing effects if the aspect ratio of the second structure domains 7 is high enough, in particular is above 1. Different deposition rates can be chosen in a continuous way, which means that the process is not limited to an on-off step function: the deposition rate is rather a continuous function to choose. Moreover for asymmetric coatings one material could be coated on one side and another material could be coated on the other side, if e.g. two different targets are used (not shown). This opens the possibility to fabricate for example effective blazed gratings (e.g. asymmetric gratings).

In order to control the deposition rate power modulation techniques can be applied. Another possibility would be to vary the plasma frequency. The inventors found that increasing the plasma frequency up to a certain upper frequency limit reduces the deposition rate, and above that limit (100 kHz or more) the deposition rate is essentially zero. Since a fast change in deposition rate is required (synchronous to the movement of the substrate) it is of advantage to use this high frequency effect. Note that in contrast to U.S. Pat. No. 6,210,540 no masking of the target is required.

Once the possible angular distributions of coating particles for different process parameters have been evaluated it is possible to simulate, for example based on particle propagation, scattering and deposition models, the deposition on the substrate as a function of position on the surface of the structured substrate to be coated. Different process parameters result in different coating geometries, said geometries also depending on the actual geometry of the microstructure in the substrate. Based on these simulations it is possible to decide on the optimum coating strategy, possibly including dynamical adjustments of the angular distribution of the particles deposition rate. Therefore the type of coating materials and the energy of their particles is adopted during the coating process together with the active and dynamic control of the angular distribution of the coating particles deposition rate to realize the desired coating geometries. For example for optical components comprising grating structures with grating periods well below the wavelength of the electromagnetic field the component is illuminated with (zero order gratings) the optical performance in most cases shows weak dependence on the grating period as long as the period is well below the wavelength. Therefore the grating period can be chosen relatively free and adopted to the coating requirements. Smaller grating periods together with the same thickness of the grating region G result in higher aspect ratios of the first structure domains.

C. Applications

There are a high number of systems applying the components comprising embedded microchannels. It is possible to distinguish between systems where the microchannels remain filled with air and such components where the component comprising the microchannels filled with air is an intermediate product and in the final system the microchannels are filled with a material different from air.

a) Applications Where Microchannels Remain Filled with Air.

In optical coating technology the range of useful optical coating materials is limited. The lower limit for index of refraction for useful hard coating materials is about 1.38 for $MgF_2$. There are materials with lower index, however those result in generally soft coatings and are not widespread in use.

For dielectric submicron grating structures it is well known that if the grating period is considerably smaller than the wavelength of the light used, the grating layers act as an artificial material with an artificial index of refraction. This index of refraction is something like an average of the materials indices in use in this grating layer. The known "effective medium theory" (in the context of zero order gratings) allows to determine the artificial index of refraction. By this stable artificial coating layers with index of refraction considerably below the index of $MgF_2$ are possible.

Consider a zero order binary grating structure on a substrate with lamellar first domain structures and lamellar second domain structures. The first domain structures are filled with $MgF_2$ and the second domain structures are empty or filled with air. The artificial index of refraction will be well below the index of pure $MgF_2$, depending on the duty cycle, which is the ratio of the first domain structure to the grating period of the grating. These structures are well known, however up to now it was not practicable to fabricate multilayer structures based on such a very low index material, because of the difficulty to overcoat the surface structures without filling the second domain structures. With the procedure according to the present invention it is now possible to realize embedded microchannels. Most of the parts of the second domain structures remain empty or filled with air. Since the structure can be completely closed it is possible to apply additional continuous or structured layers.

1. Birefringent Layers

For one-dimensional zero order grating structures the previously mentioned effective medium theory leads to an orientation dependent effective index. The effective index parallel to the grating lines is different from the effective index perpendicular to the grating lines. Based on the present invention it is now possible to realize multilayer stack birefringent layers. This allows to design and fabricate broadband polarizing beam splitters which are not angular dependent, non-polarizing color filter and dielectric mirror showing no angular dependency.

As a more specific example the possibility to create a polarizing beam splitter which is not angular dependent is discussed. For non-conical incidence the light can be orthogonally separated in TM-polarized light and TE-polarized light. For TM-polarized light the electric field vector oscillates in the plane of incidence, which is the non-conical plane as defined before. For TE-polarized light the electric field vector oscillates perpendicular to the plane of incidence. Basis of the polarizing beam splitter is a quartz substrate with index of refraction of 1.48. On this quartz substrate a dielectric zero order grating based on $TiO_2$ is realized, the duty cycle of which is chosen in such a way that for TM polarization the artificial index corresponds to n(TM)=1.48. As this is a one-dimensional grating structure the artificial index of TE-polarized light will be well above. According to the procedure of the present invention this grating structure is covered with an $SiO_2$ coating with index of refraction close to n=1.48. Another $TiO_2$ grating is applied to the system with preferably the same duty-cycle as before leading to the same artificial indices. With such a method a multilayer stack can be built. The TM-polarized light will always face an index of refraction close to n=1.48, in case the cover material also is quartz. The TE-polarized light in contrast will propagate in a multilayer system with alternating high and low index layers. The thickness of these layers can be adjusted so that the TE-polarized light is reflected very efficiently, whereas the TM-polarized light will transmit very efficiently. It is clear that the thicknesses of the layers can be designed in order to reflect only part of the incoming light, leading to wavelength dependent polarizing beam splitters, useful for example for an image projection apparatus. Other transparent substrate materials such as glass, particularly BK7, SF1, SF2; or plastic can be used. If so, the layout of the structures and the layers needs to be adjusted.

2. Simple Overcoat.

It is a widespread problem that micron or submicron surface structures which are open to the environment are easily ruined due to dust scratches or other environmental influences. This is particularly true for the so called wire grid polarizers based on one-dimensional zero order grating structures with thin metal wires filling the fist structure domains and the second structure domains remaining filled with air. Coating the wire grids according to the prior art affects directly the optical performance of the polarizer, since this fills the second structure domains with coating material. Coating these wire grid polarizers with an overcoat according to the present invention protects these structures almost without filling the second structure domains. Taking the overcoat into account during the design of the layout with respect to optical characteristics even has potential to improve the optical performance, especially if the overcoat comprises a multilayer stack, typically a dielectric stack of alternating materials. Another aspect is that silver would be the material of choice for these metal grids. However silver without protection exposed to the environment degrades in a very short time leading to minor optical performance. This is the reason why typically aluminum is used for the wire grids. The possibility of coating silver gratings without filling the second structure domains or without filling them completely in order to environmentally protect the silver enables the use of silver wire grids in such applications. In this case it can be helpful to extend the (thin) side wall covers 11 down to the bottom of the microchannels 15,15' in order to additionally protect the silver containing first structure domains.

b) Applications, Where the Component According to the Present Invention is an Intermediate Product.

The possibility of realizing microchannels within a grating structure, connected to the environment via thin connection channels opens the possibility to fill the microchannels with fluids. The filling process can be based on capillary forces.

i) Wire Grid Polarizers.

Figure 2:
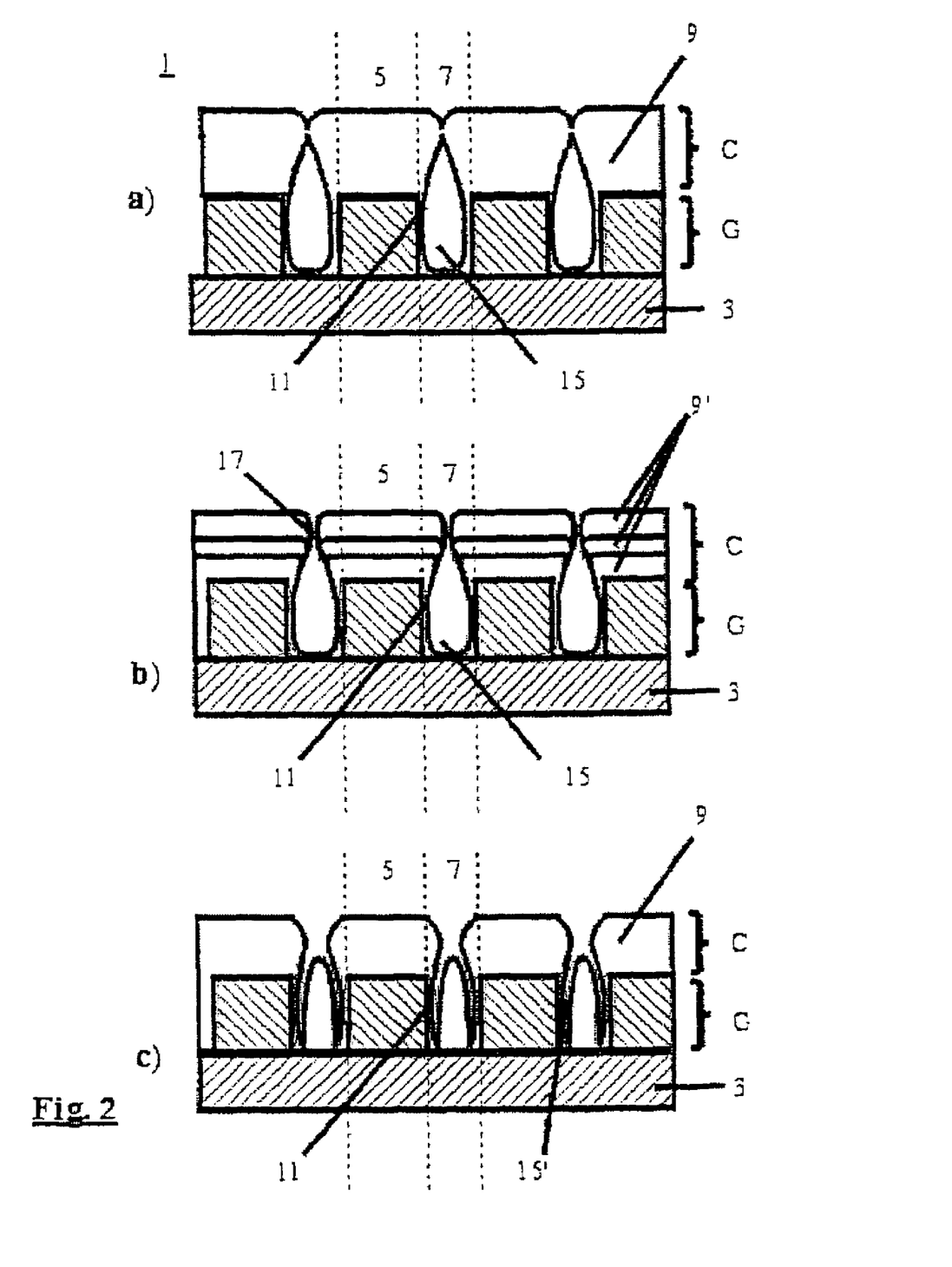
FIG. 2a is a cross-section of a coated structure according to the present invention with microchannels separated from the environment.
FIG. 2b is a cross-section of a coated structure according to the present invention with structured coating stack and with microchannels connected to the environment.
FIG. 2c is a cross-section of a coated structure according to the present invention with microchannels forming thin elongated channels.
Figure 4:
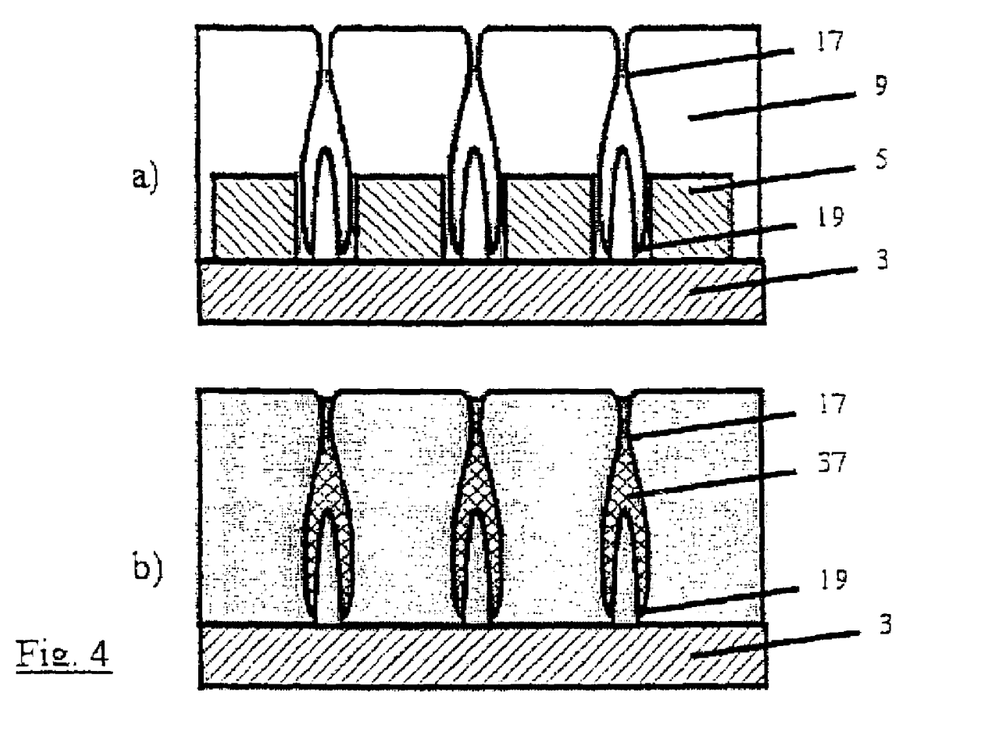
FIG. 4a is a cross-section of a structure with microchannels connected to the environment and filled with air.
FIG. 4b is a cross-section of the structure of FIG. 4a having the microchannels filled with fluid.

As shown in FIG. 2, there are different possible layouts for the microchannels 15,15'. In some cases their shape is close to the optimum of the shape a metal wire should have in order to transmit one polarization effectively while the other polarization is reflected. Such a preferred shape is a structure where the wire at the top forms a long connection channel 17 and the bottom has the shape of one or more sharp edges 19, as indicated in FIG. 4a for the microchannels. Note that the material of the first structured domain 5, the coating material and the substrate material can be the same. A melt of metal or a solvent can now be applied on the top of the device sealing the connection channels 17, so capillary forces drag this fluid into the microchannels. Therefore the microchannels are now filled with fluid 37 which form wire grids having the preferred geometry, as shown in FIG. 4b. Once the fluid 37 is in the microchannel it can be changed to its solid sate, for example by cooling a melt, if given.

ii) Applications with Fluids

Figure 5:
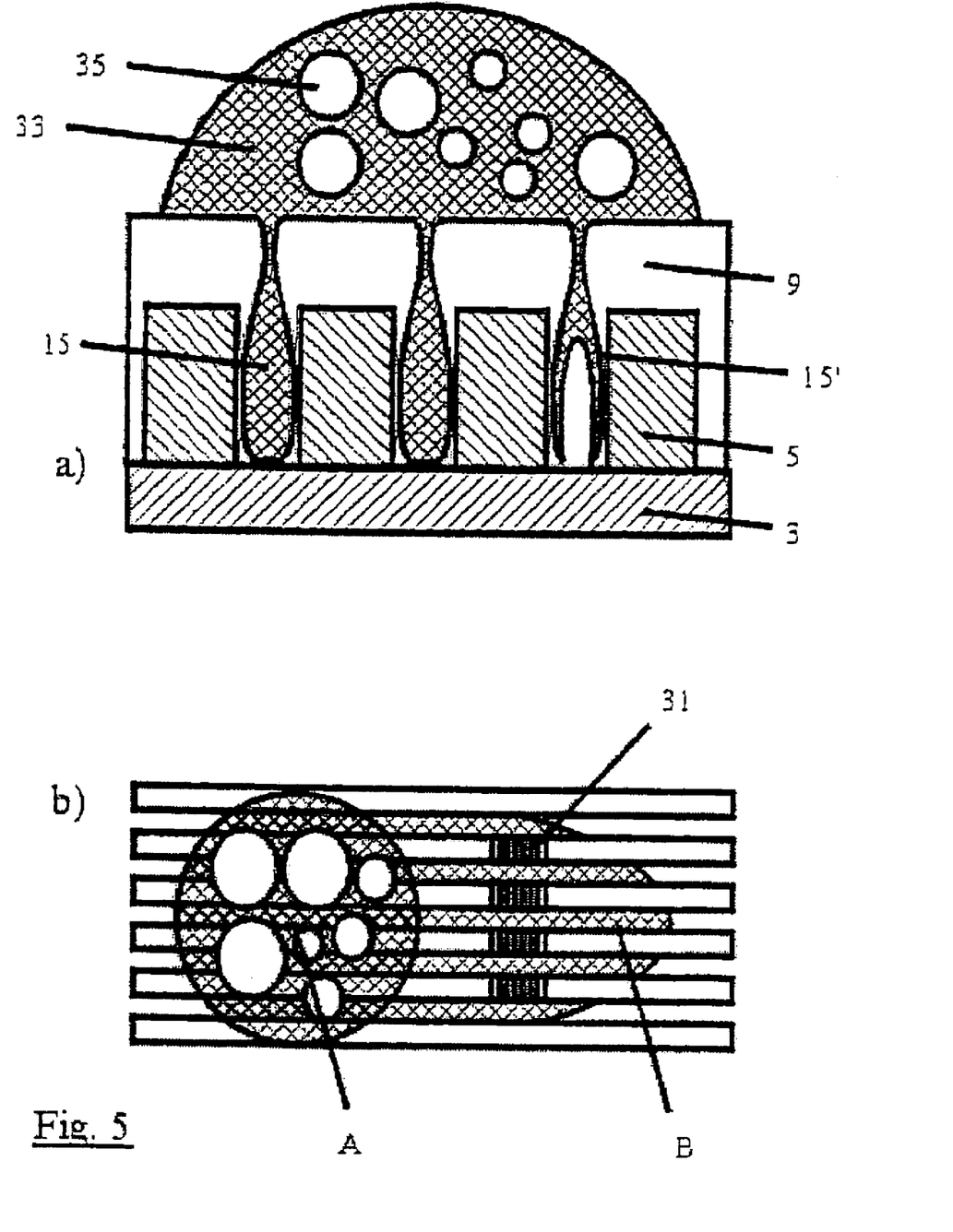

The same capillary forces can be used to pull a liquid (or more generally chemical reagents or reaction products) from spot A to spot B on a two dimensional component (see FIGS. 5a and 5b). Spot A can be functional in one way, i.e. its function can be to confine a reagent e.g. realized by a hydrophobic overcoat over the grating according to the invention where a drop or liquid can be deposited onto. It can further act as a filter, e.g. to filter solid components of blood or precipitated peptides from a liquid that is to be analyzed. The grating structure with microchannels thereby acts as a transport medium to spot B where a chemical reaction takes place. Here the surface can e.g. be covered by a chemical that can react with the liquid and be detected, e.g. in a fluorescence detection scheme. In a preferred embodiment the overcoat of the grating and the chemical sensibilization of the surface are distinct from each other in spot A, and spot B or additional spots on the device.

This is, of course, not limited to two spots A And B with transport region in between but is extended to an array of spots.

The size of the spots can be chosen from 0.05 mm typical dimension to 5 mm typical dimension. Of course this can be extended to other than biological chemical reactions.

To give a more specific example an analytical platform for filtering particles in fluids is described (see FIGS. 5a and 5b). The possibility of choosing the width of the connection channels opens the possibility of filtering particles 35 dispersed in a fluid 33. If for example a droplet containing particles 35 with size larger than the width of the entrance channel is dispersed on the device, due to capillary forces the fluid 33 will be attracted into the channels and spread out, along the channels in areas away from the originally position of the droplet. On the device the remaining larger particles can be analyzed. The pure fluid in the channels can be analyzed separately.

The width of the connecting channels can be chosen very accurately. Therefore it is possible to separate large particles which are blocked at the connection channels from smaller particles which can enter the microchannels. With the production process according to the present invention it is possible to realize gradient characteristics along the microchannels. There are different possibilities to realize this: One possibility is to realize domain structures 5 on the substrate which are long elongated elements with empty second domain structures 7 in between, the width and/or depth of the second domain structures 7 being in the range of several micrometers or below and the width of the second domain structures continuously varying along at least part of the length of the elongated elements. Coating the first domain structures 5 according to the present invention results in microchannels with variable width along at least part of the length of the microchannels. Another possibility is to realize the variation of the width of the microchannels by introducing a gradient in the coating parameters as a function of position on the substrate along the elongated elements and thereby introducing with respect to the position on the substrate along the elongated elements a dependence of the angular distribution of the coating particles. This realization of gradient characteristics in the microchannels allows for example to further separate particles of different size from each other.

In another application of the present invention the analytic component is used as stabilization means for membranes, in particular biological membranes, the stabilization providing free standing areas of the membrane in air or in fluids. In order to achieve this an analytical platform according to the present invention is used with connection channels 17 of well-defined width. The membrane is positioned directly or indirectly on top of the cover layer C of the analytical platform. Parts of the membrane are connected to or at least indirectly in contact with the surface of the cover 9. Free standing parts of the membrane cover the connection channels 17. In some cases it is even possible to stabilize the membrane on the uncoated first structure domains, however coating the first structure domains according to the present invention allows a direct and accurate control of the width of the free standing part. If the free standing parts comprise proteins or receptors or other functional means of membranes and in particular biological membranes it is possible to investigate the reactions and/or the dynamics of an almost unperturbed system. Fluids can be applied to the free standing part membrane on both sides: on the side connected to the microchannels and on the other side of the membrane opposite to the microchannels. The fluid on the one side can differ from the fluid on the other side. For example different concentrations of ions can be realized and diffusion processes can be investigated.

In some biological processes the penetration of a specific substance on one side of the membrane leads to a specific reaction on the other side of the membrane. Coupling for example a specific substance to the membrane from the environment can for example in a messenger substance leaving the membrane diffusing into the microchannel which can be analyzed. In some cases this leads to a change of the pH-value which can result in a change of the color of the fluid which can be detected with different optical methods.

Different optical schemes can be used for analyzing purposes. For example the first structure domains 5 could form waveguides. These waveguides can be designed in such a way that light propagating in this waveguide establishes an evanescent field in the microchannels 15, 15'. In FIG. 5*b* shown in addition are coupling gratings 31 for coupling light in or out of the waveguides. Gratings can be used as well to couple light out of the hollow spaces. In general this allows for example the detection of particles labeled with fluorescence markers. Even more general this device enables label detection as well as label free detection.

It has been shown, how components with embedded microchannels can be realized on the basis of submicron structures. Typically such structures are periodic structures with typical feature sizes between 20 nm and 1 μm. The depth ranges typically from 5 nm to 3 μm. However these numbers represent only typical values; other dimensions are possible as well. The basic idea to choose the layout of optical and/or analytical components adapted to practicably producible microchannel geometries has been described in different examples throughout this disclosure. In addition it was explained how the geometry of the microchannels can be influenced by using special coating techniques. Examples have been given for applications of such components with the microchannels filled with air as well as filled with some other materials. This was mentioned to be possible because of the capillary forces. However it is clear that other forces could be applied as well, such as pressure, magnetic or electrical forces. In addition to capillary forces it is possible to use centrifugal forces by rotating the device with a rotation axis parallel to the surface normal in order to drag the fluids within the microchannels away from the point where they entered the microchannels.

It is clear that the scope of the present invention goes beyond the examples given for illustrative reasons. Clearly in the scope of the present invention is the possibility to have single or multilayer stack between the substrate 3 and the grating region G as well as on the backside of the substrate 3 or on top of the cover region C. These stacks can be used to introduce stress compensating layers, to enhance optical performance, to introduce conducting layers or other electrical, optical, mechanical and/or chemical effect.

What is claimed is:

1. A method for filtering particles from a fluid comprising the steps of:
   providing an analytical platform comprising: a substrate; an array of microstructures on the substrate; an application surface located opposite said substrate relative to said microstructures; and a plurality of microchannels defined respectively between adjacent ones of said microstructures, said plurality of microchannels each having a first width at a first distance from said substrate and a second width at a second distance from said substrate, said first distance being shorter than said second distance, said second width being a minimum width that is smaller than said first width in each microchannel, said minimum width being equal to or less than a minimum dimension of particles to be filtered out of a fluid;
   applying the fluid to said application surface;
   using capillary forces to make the fluid enter said plurality of microchannels through the respective minimum widths thereof, wherein the particles to be filtered out of said fluid are prevented from passing through the minimum widths of said plurality of microchannels; and
   using at least one of capillary forces, gravity forces, and centrifugal forces to spread the fluid that has passed through the minimum widths of said plurality of microchannels along said microchannels into areas of the analytical platform where no fluid to be filtered was applied to the application surface.

2. A method for filtering particles from a fluid comprising the steps of:
   performing the method according to claim 1 at a first area A of the analytical platform; and
   transporting in a transport region of the analytical platform the fluid from the first area A to at least a second area B of the analytical platform where a chemical reaction takes place.

3. The method according to claim 2, further comprising applying a chemical that can react with said fluid to said application surface in area B, and detecting a reaction between said fluid and said chemical.

4. The method according to claim 3, wherein said reaction is detected by a fluorescence detection scheme.

5. The method according to claim 2, wherein the analytical platform comprises an array of area A regions, area B regions and transport regions.

6. A method for filtering particles from a fluid comprising the steps of:
   providing an analytical platform comprising: a substrate; an array of microstructures on the substrate; an application surface located opposite said substrate relative to said microstructures; and a plurality of microchannels defined respectively between adjacent ones of said microstructures, said plurality of microchannels each having a first width at a first distance from said substrate and a second width at a second distance from said substrate, said first distance being shorter than said second distance, said second width being a minimum width that is smaller than said first width in the respective microchannel, said plurality of microchannels each having gradient characteristics in the minimum width along the channel;
   applying the fluid to said application surface;
   making the fluid enter said plurality of microchannels through the respective minimum widths thereof, wherein the particles to be filtered out of said fluid are prevented from passing through the minimum widths of said plurality of microchannels and, because of the gradient characteristics, separating the particles according to their size; and using at least one of capillary forces, gravity forces, and centrifugal forces to spread the fluid that has passed through the minimum widths of said plurality of microchannels along said microchannels into areas of the analytical platform where no fluid to be filtered was applied to the application surface.

* * * * *